US008951000B2

(12) United States Patent
McIntosh et al.

(10) Patent No.: US 8,951,000 B2
(45) Date of Patent: Feb. 10, 2015

(54) ENHANCED COMPUTER RACK HAVING AN INTEGRATED LIFT RAIL AND/OR TOOL DESIGN

(75) Inventors: Steven C. McIntosh, Kingston, NY (US); Budy D. Notohardjono, Poughkeepsie, NY (US); Kevin R. Qualters, LaGrangeville, NY (US); Howard P. Welz, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 13/452,844

(22) Filed: Apr. 21, 2012

(65) Prior Publication Data

US 2012/0207573 A1    Aug. 16, 2012

Related U.S. Application Data

(62) Division of application No. 11/782,703, filed on Jul. 25, 2007.

(51) Int. Cl.
*B66F 9/18* (2006.01)
*H05K 7/18* (2006.01)
*H05K 7/14* (2006.01)

(52) U.S. Cl.
CPC ............... *H05K 7/18* (2013.01); *H05K 7/1488* (2013.01)
USPC .......................................... 414/607; 211/209

(58) Field of Classification Search
USPC ......... 414/471, 589, 592, 553, 663, 659, 630, 414/631, 267, 266, 247, 246, 277, 608, 607, 414/609, 660, 662; 104/127, 128, 129; 211/41.12, 94.01, 162, 209, 201, 26; 361/679.02, 725; 312/223.3
See application file for complete search history.

(56) References Cited

U.S. PATENT DOCUMENTS

| | | | | |
|---|---|---|---|---|
| 2,853,161 | A | | 9/1958 | Mascari ........................... 52/212 |
| 3,945,510 | A | * | 3/1976 | Saul et al. ...................... 414/286 |
| 3,964,573 | A | | 6/1976 | Wilson .......................... 182/116 |
| 4,265,583 | A | * | 5/1981 | Baird et al. ................... 414/284 |
| 4,269,285 | A | | 5/1981 | Ohkoshi et al. ............... 187/270 |
| 4,516,663 | A | * | 5/1985 | D'Alessio et al. ............ 187/270 |
| 4,975,012 | A | * | 12/1990 | Motoda ......................... 414/279 |
| 5,676,320 | A | * | 10/1997 | Merklinger ............ 241/101.741 |
| 5,687,858 | A | | 11/1997 | Bouche ......................... 211/121 |
| 6,065,821 | A | * | 5/2000 | Anderson et al. ............. 312/408 |
| 6,484,893 | B1 | | 11/2002 | Tkatch ....................... 211/94.02 |
| 6,588,691 | B2 | * | 7/2003 | Yamamoto et al. ...... 241/101.74 |
| 6,830,132 | B1 | * | 12/2004 | Kang et al. .................... 187/373 |
| 6,896,467 | B2 | | 5/2005 | Bouche et al. ................ 414/277 |
| 7,019,230 | B1 | * | 3/2006 | Vaill et al. ................... 200/50.24 |
| 7,090,457 | B2 | * | 8/2006 | Martin .......................... 414/277 |
| 7,123,485 | B1 | | 10/2006 | Henderson .................... 361/724 |
| 7,201,279 | B1 | | 4/2007 | Mimlitch et al. ............... 211/26 |
| 7,614,509 | B2 | | 11/2009 | Nguyen .......................... 211/26 |
| 2004/0080244 | A1 | | 4/2004 | Lowther et al. ............... 312/205 |
| 2008/0131241 | A1 | * | 6/2008 | King .............................. 414/267 |

* cited by examiner

*Primary Examiner* — Saul Rodriguez
*Assistant Examiner* — Glenn Myers
(74) *Attorney, Agent, or Firm* — Margaret A. McNamara; Ido Tuchman

(57) ABSTRACT

An enhanced computer rack having sides is provided. The rack is used for housing electronic components and comprises in one embodiment of a lift rail having a plurality of multipurpose frame members capable of being engageably connected to at least one of the rack sides such that the frame members can be retracted into or extended out from the rack. In an alternate embodiment, a lift tool is provided for hoisting object into the rack. The lift tool is connected to at least one side of the rack and is capable of being retracted inside or being extended out from the rack. The two embodiments can also be combined to provide an enhanced rack with an integrated lift rails and lift tool design.

12 Claims, 5 Drawing Sheets

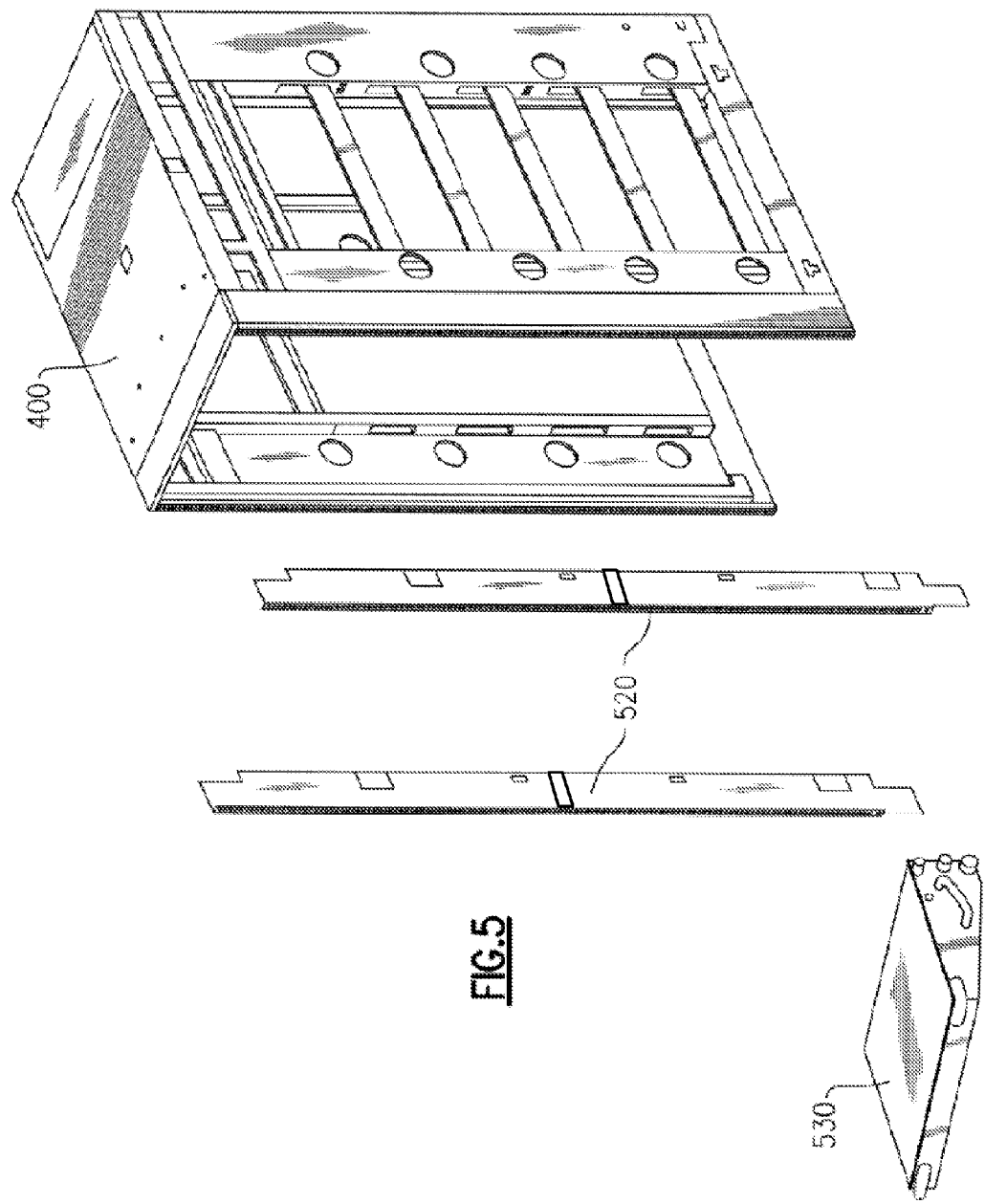

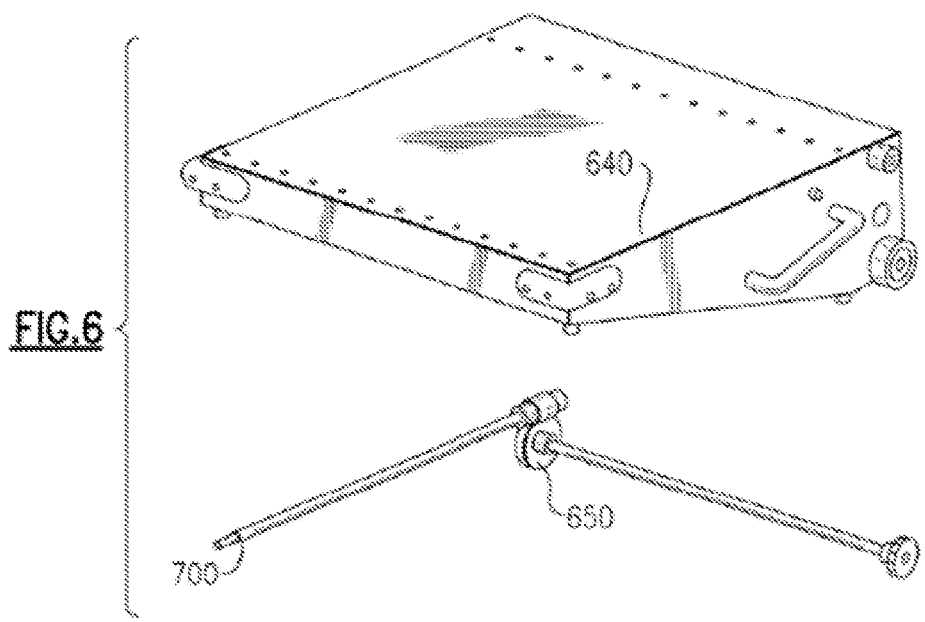
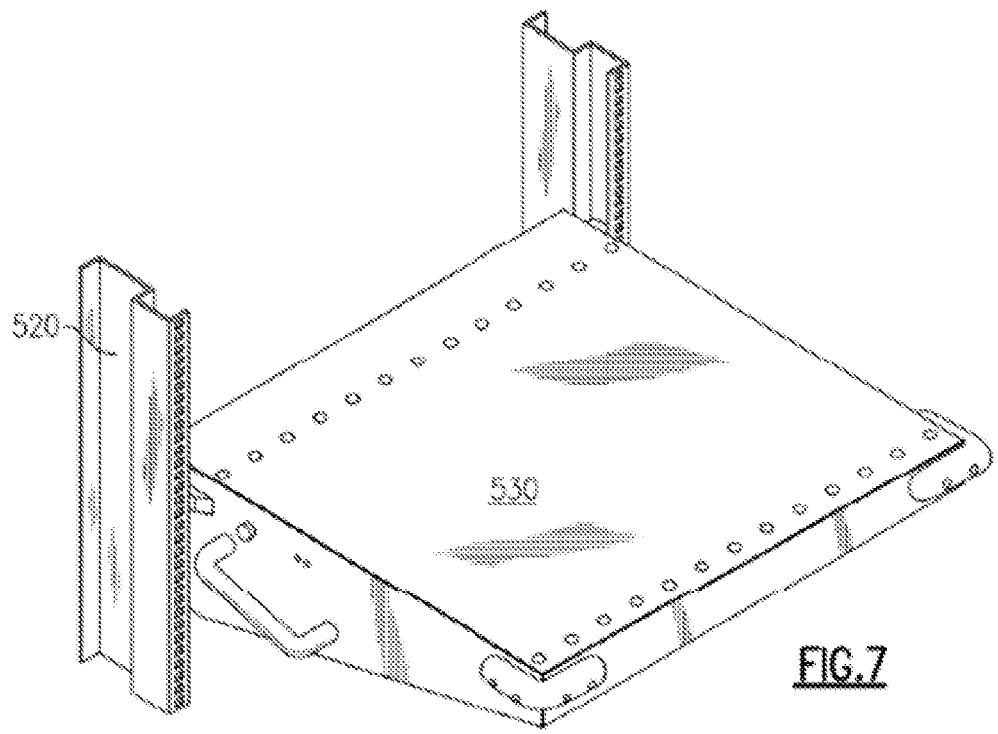

ENHANCED COMPUTER RACK HAVING AN INTEGRATED LIFT RAIL AND/OR TOOL DESIGN

CROSS-REFERENCE TO RELATED APPLICATIONS

This application is a divisional application claiming priority under 35 U.S.C. §120 to U.S. patent application Ser. No. 11/782,703 filed Jul. 25, 2007, the entire text of which is specifically incorporated by reference herein.

BACKGROUND OF THE INVENTION

1. Field of the Invention

This invention relates to packaging of computing systems and more particularly to packaging of large computing systems having racks for housing electronic components.

2. Description of Background

The industry trend has been to continuously increase the number of electronic components inside computing systems. While increasing the components inside a simple computing system does create some challenges, such an increase creates many problems in computing systems that include one or more large computers. In such instances many seemingly isolated issues affect one another, especially when packaged together in a single assembly, or networked or housed to other systems that are stored in close proximity.

One of the many challenges facing the industry today is the problem of packaging electronic components. A number of issues, including but not limited to heat dissipation, load balancing, electromagnetic interruptions, and even noise management, must be addressed when designing large systems. Furthermore, price constraints and performance needs as well as other factors such as packaging density, scalability and availability place additional demands on the designs of these packages.

The end result is often heavy units that have to be shipped, installed and serviced with great difficulty. Often two or more service personnel using a multitude of devices such as independent hoists have to be provided for installation and service of these units. Consequently, due to the difficulty of installation and servicing of these units, service and installation calls are delayed, which in turn affect system availability for the customer(s). In conclusion, there is a need for a better method and design that can simplify installation and service procedures when using large computers.

SUMMARY OF THE INVENTION

The shortcomings of the prior art are overcome and additional advantages are provided through the provision of an enhanced computer rack with an integrated rail and/or tool lift assembly. The rack has sides and is used for housing electronic components. In one embodiment the rack comprises a lift rail having a plurality of multipurpose frame members that are capable of being engageably connected to at least one of the rack sides such that the frame members can be retracted into or extended out from the rack. In an alternate embodiment, a lift tool is provided for hoisting objects onto/into the rack. The lift tool is connected to at least one side of the rack and is capable of being retracted inside or being extended out from the rack. The two above mentioned embodiments can be used separately or combined to provide an enhanced rack with an integrated lift rail and lift tool design.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 5 is an illustration of different components comprising the lift tool as provided in the embodiment of FIG. 4;

FIG. 6 is an illustration of the lift shelf as per embodiment of FIG. 5; and

FIG. 7 illustrates the operation of lift tool as per embodiment of FIG. 4.

DESCRIPTION OF THE INVENTION

Figure 1:
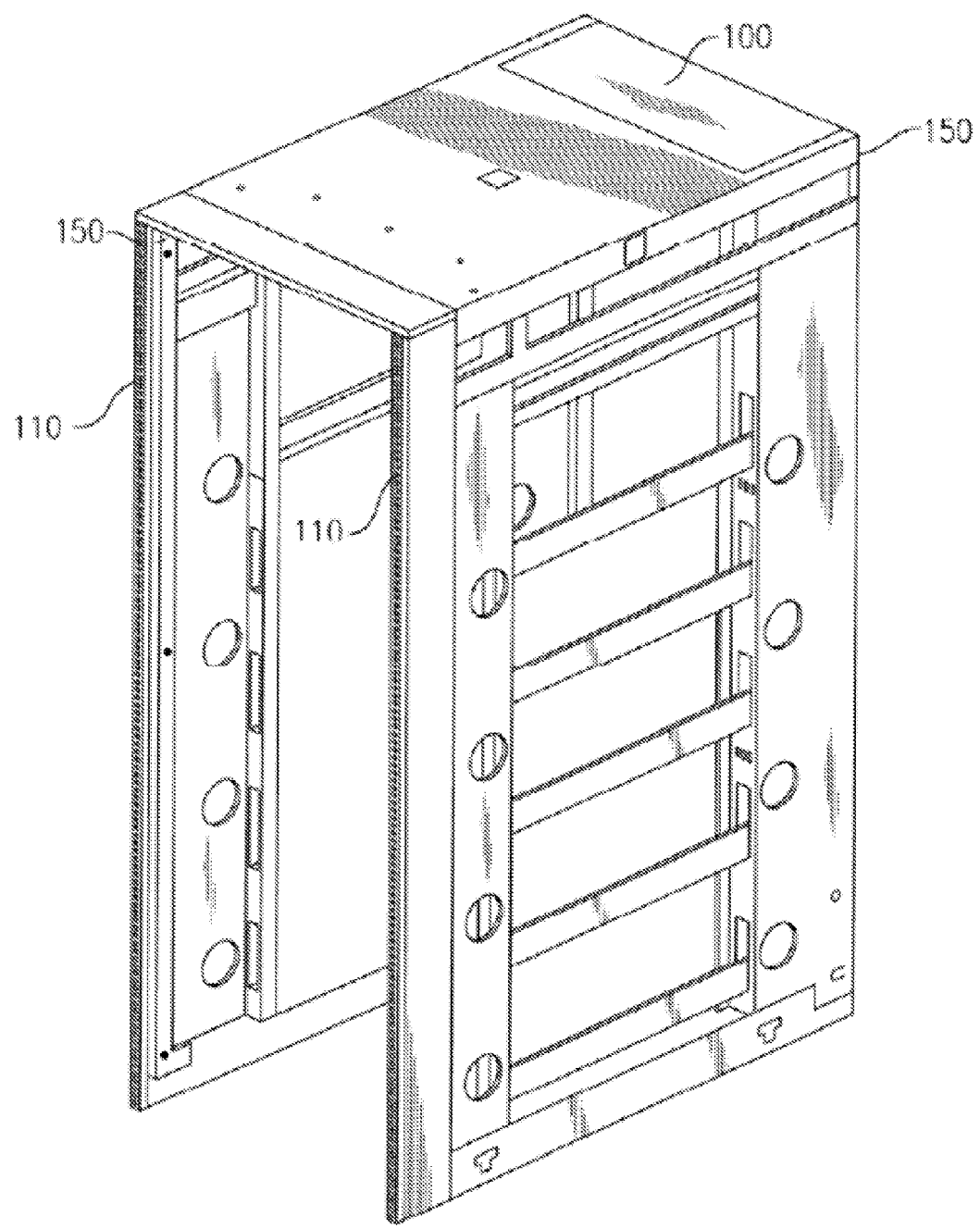
FIG. 1 is an illustration of a multipurpose rack having a lift rail design as per one embodiment of the present invention.
Figure 4:
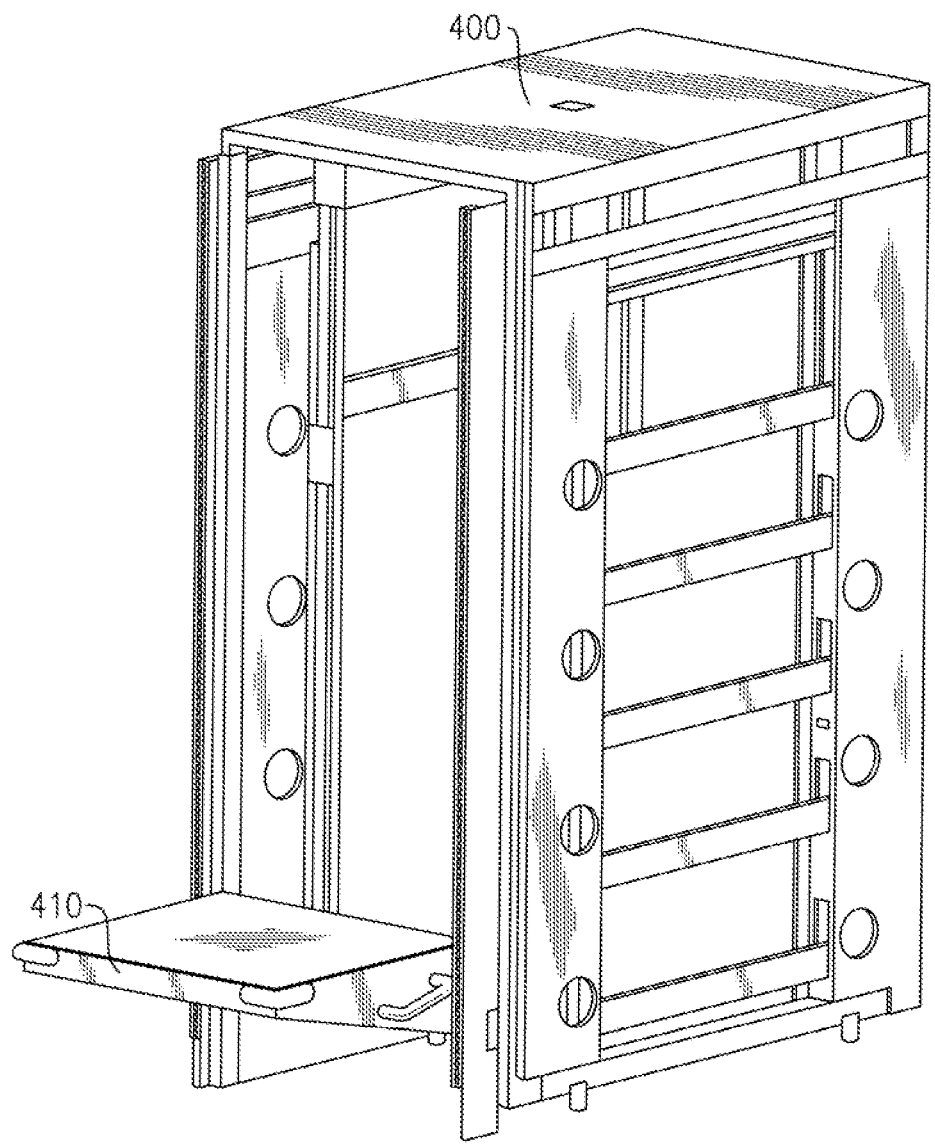
FIG. 4 is an illustration of an alternate embodiment of the present invention incorporating a lift tool into the enhanced rack design.

The present invention provides for a multiple purpose design. In FIGS. 1 though 3, one embodiment of the present invention will be explored that is related to an enhanced rack incorporating an integrated rail tool design. In FIGS. 4 though 7 an alternate embodiment is presented. In this embodiment, an integrated "Lift Tool" design is incorporated into the rack. The two above mentioned embodiments can be used and incorporated into the rack design as separate features or combined with one another to provide an even more enhanced and robust design as will be discussed presently. It should be noted that each feature and embodiment, separately or in combination, is designed specifically to improve availability by minimizing the time required to install, service and maintain these large systems.

Referring back to the first embodiment, FIG. 1 is an illustration of an enhanced computer rack or frame 100 used for housing electronic components such as used in servers and other large computing system environments. The enhanced rack 100 as provided by the illustrated figure has a cage like structure. However, this structure is only provided as way of example and other arrangements and rack designs can be used in conjunction with the teachings of the present invention. In addition, although the rack or frame as shown does not include any side enclosures such as doors, the design is only provided in this way for visual ease and doors can be incorporated in the design of the rack.

Referring back to FIG. 1, in this embodiment, one or a plurality of frame members referenced as 110 are secured to one or more side of rack 100 as illustrated. When service is required or during installation of components, these frames member(s) 110 can quickly and easily be extended out from the rack and are equipped to hoist or slide objects into the rack. In other words, the lift rails are used to raise and lower hardware and other components into/unto the rack. As will be later discussed, in different embodiments features can be incorporated that provide directional movement of objects by way of the frames as rails or otherwise.

The multipurpose frame member(s) 110 remains in its retracted position (i.e. inside the computer rack) at other times so as to provide normal frame function during routine operation of the IT equipment as illustrated in FIG. 1. When IT equipment service or upgrades are required, however, as was discussed before these frame members 110 are extended into position where they create "Lift Tool Rails" that can be used in conjunction with a "Lift Tool Shelf" as will be discussed later in conjunction with other embodiments. In this manner, the total service time will be reduced by eliminating the need to locate and install lift rails conventionally used that are separate from the computer rack 110.

This enhanced computer rack 100, with its incorporated multipurpose frame member(s) 110, can also be designed to serves as a low impedance ground path that allow the computer rack 100, frame members 110, and rack doors, when supplied, to provide the required safety grounding and EMC noise containment required on most large computer system environments. In addition, when the frames member(s) 110 are extended, the multipurpose rack 100 can act as a deeper frame than used normally. This is a desired feature as different frame depths have been introduced to address a variety of needs. In this way, the multipurpose rack 100 can then provide for different frame depths in one frame design.

Figure 2:
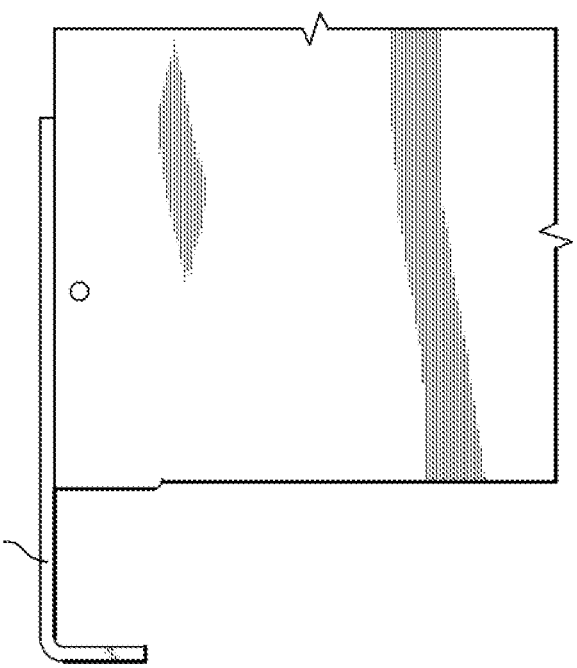
FIGS. 2 and 3 are an illustrations of the rack of the embodiment provided by FIG. 1, showing the extension and retraction of the multipurpose frame member(s)

In FIG. 2, the frame member 110 is shown to be formed specially and therefore now referenced as 120. The members 120 are specifically formed so that they can be added to a plurality of corner posts referenced as 150 in FIG. 1. In this embodiment, four corner posts 150 are provided although it is not visually possible to see all of them in the illustrated figures. In this way, each formed frame member(s) 120 can be added to each of the four corner posts 150 of the rack 100 as illustrated. In the context of the computer rack 100, these frame members 120 are designed to maintain a low profile such that they do not occupy significant space in either the outboard/decorative side panel area, or in the inboard area of the rack where the IT equipment resides.

The frame members 110/120 can be held in place by a variety of ways as known to those skilled in the art. For example the frame members 110/120 can be held in place via captive fasteners. In one embodiment, the frame members 110/120 are aligned to the corner posts via an arrangement of pins and slots which allow the frame members to be moved freely while also providing the registration required to allow the parts to function properly.

Figure 3:
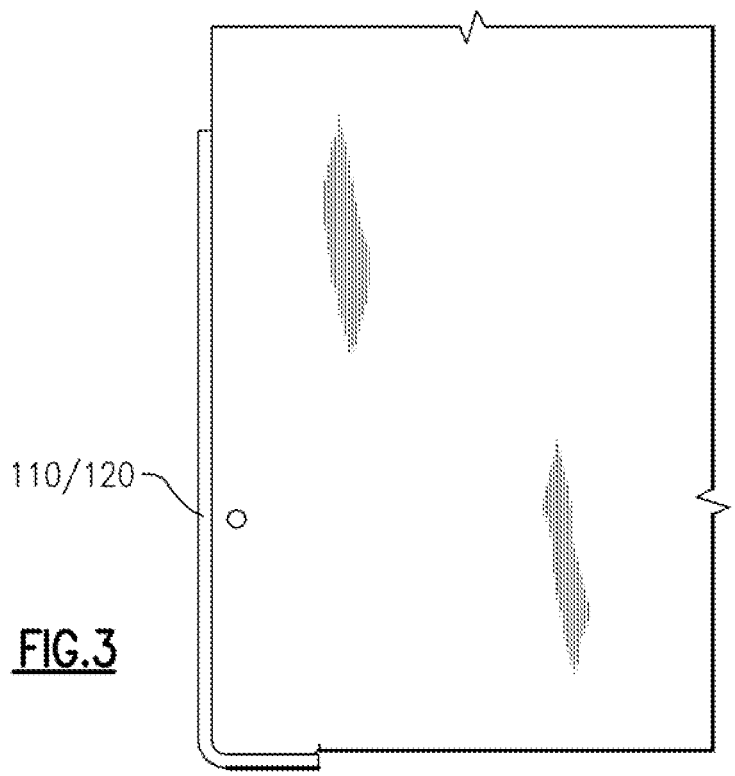

As discussed earlier, during normal operation, the frame members 110/120 are fully retracted as shown in FIGS. 1 and 3. In this arrangement the frame members 110/120 serve the same function as a conventional corner post, providing the physical interface between the rack 100 and the rack doors (not shown). When used in this capacity, multiple contact points and mechanical fasteners used to secure the frame members to the corner posts also provide a low impedance ground path that allow the computer rack, frame members, and rack doors to provide the required safety grounding and EMC noise containment required for servers and other large computers as previously stated. FIG. 3 provides a better illustrated view of this concept.

In FIGS. 4 through 7, an alternate embodiment of the present invention is illustrated. FIG. 4 also provides for a similar rack 400 for housing electronic components. This rack 400 can be a conventional rack or the multipurpose rack as was discussed in FIGS. 1 through 3. The alternate rack design as will be discussed in conjunction with FIGS. 4 though 6, additionally provides for a lift tool 410. The lift tool can be, in one embodiment, an extension to the frame 400 as illustrated that one person can use to easily install and or remove components from the rack.

In this embodiment, the computer rack 400 itself can be used as a part of the lift tool mechanism 410, providing structural support, alignment, and ballast to the lift tool mechanism 410. It can also be used as a removal tool when appropriate and as needed.

The result is as will be hereinafter referenced as the "Lift Tool" 410 is much more compact and stable than an independent hoist. Furthermore, the integrated nature of the Lift Tool 410 makes installation or removal process of devices much simpler and safer as compared to attempts to transfer large, heavy items between 2 independent structures (i.e. such as conventional computer racks and standalone hoists).

FIGS. 5 and 6 provide different components that comprise the Lift Tool 410. In the embodiment provided by the illustration of FIG. 5, the Lift Tool 410 is shown to be comprised at least of lift rails 520 and a lift shelf 530. The lift rails 520 are preferably designed to be compatible with the computer rack 400 such that the rails are aligned and mechanically fastened to either the front or rear corner posts of the computer rack. Each lift rail 520 may either be a single unit that spans the entire height of the rack, or can alternatively be broken up into multiple interlocking segments which are smaller and easier to store and handle.

The lift rail 520 can also include a channel and a series of notches that are designed to interface with the lift shelf 530, but this design is only optional. The lift rail 520 can be used with any type of rack. The mounting of the lift rail to the rack is accomplished by a variety of methods as known to those skilled in the art that can include its mounting via fasteners at the top, mid point and bottom of the lift rail.

FIG. 6 provides a more detailed illustration of one embodiment of the lift shelf 530. In this embodiment, the lift shelf 530 comprises of a lift platform 640 and a lift mechanism 650. The lift platform can be comprised of a low friction material to allow for heavy objects to be easily transferred on and off the platform. The platform can further comprise a series of mounting features that can selectively accommodate any number of custom hardware products, as known to those skilled in the art such as guides, slides, and intermediate transfer shelves, that would be required to service unique devices or for other selective needs and purposes.

The lift mechanism 650 can be further comprised of a sprocket and roller bearings on each side of the lift shelf Working in concert with the lift rails, these sprockets and bearings allow the shelf to travel directionally, preferably in an up and down direction. As illustrated in FIG. 7, when assembled, the lift shelf 530 can be cranked directionally, preferably in an up and down direction, by way of a user operated drive shaft 700 that controls the sprockets.

As discussed earlier, the lift tool concept as discussed in conjunction with FIGS. 4 through 7 can be incorporated into the rail lift structure that was previously discussed in conjunction with FIGS. 1 through 3. Referring back to FIG. 2, as per one embodiment of the present invention, when the two above mentioned embodiments are combined, the features of the frame members and the rack corner posts combine to provide all the features and functions required of an effective "Lift Rail". When extended, as shown in FIG. 2, the separation between the frame members and the corner posts creates a "channel" that will accommodate the roller bearings of a "Lift Shelf". Preferably, a series of notches can also be incorporated to work in concert with "Lift Shelf" sprockets. In one embodiment, these notches can be placed on the frame member 120, but could also be incorporated on the rack corner post 150 as well.

Today's IT solutions are driven by price/performance, packaging density, scalability, and availability. To satisfy these industry needs, the building blocks that are used in large computing environments are complex, and powerful. Yet these very systems must also be easy to service and upgrade in a timely manner. Providing systems that are hard to service or install have impacted customer satisfaction and speed of doing business. The present invention provides ways that when incorporated will greatly improve availability by minimizing the time required to service or install these large systems. This is accomplished through the development of multipurpose computer rack frame rail members that are incorporated directly into the rack and/or that of the lift tool design. Each of these designs can be incorporated easily into the existing systems. They can either be used independently and separately, or as stated in combination as a single and incorporated design to provide even further flexibility during service and installation of these systems and their components.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An enhanced computer rack for housing electronic components and having a plurality of sides, comprising;
    a plurality of multipurpose frame members capable of being engageably secured to at least one of said rack sides such that said frame members can be retracted into or extended outwards from said rack;
    said multipurpose frame members also including lifting means and rails such that when extended into position they create lift tool rails for lifting objects and sliding them into said rack.

2. The assembly of claim 1 wherein said multipurpose frame members are held in place via captive fasteners.

3. The assembly of claim 1 wherein said rack comprises a plurality of corner posts and said frame members are specially formed to engage with said corner posts so that said rack can be secured to said frame members.

4. The assembly of claim 3, wherein said frame members are aligned to said corner posts via an arrangement of pins and slots which allow said frame members to be moved freely.

5. The assembly of claim 4 wherein said frame members and said rack corner posts are designed such that when engaged they provide lift rails.

6. An enhanced computer rack used for housing electronic components and having a plurality of sides including a top and bottom side, comprising:
    a lift tool connected to at least one of said rack sides and capable of being retracted inside said rack or being extended out from said rack for hoisting and placement of objects into said rack; and
    a plurality of corner posts at one or more corners of said rack where said sides meet;
    wherein said lift tool further comprises a plurality of lift rails and a lift shelf, said shelf having a lift platform and a lift mechanism used such that said tool can be used selectively for lifting and removal of objects;
    wherein said lift platform is comprised of a low friction material and one or more mounting features for accommodating selective installation and service requirements and needs;
    wherein said lift mechanism further comprises a sprocket and roller bearings placed on each side of said lift shelf such that when working in concert with said lift rails, said sprocket and bearings allow said shelf to travel directionally in an up and down direction.

7. The assembly of claim 6 wherein said lift rails are aligned and mechanically fastened to either front or rear corner posts.

8. The assembly of claim 7 wherein each lift rail is comprised of a variety of interlocking segments.

9. The assembly of claim 7 wherein each lift rail spans entire height of said rack.

10. The assembly of claim 6 wherein said lift rails include a channel and a series of notches that are designed to interface with said lift shelf.

11. The assembly of claim 10 wherein said lift rails are mounted to said rack via fasteners placed at top, mid point and bottom of said lift rail.

12. The assembly of claim 6 wherein said lift shelf further comprises a drive shaft to allow it to be cranked directionally; said drive shaft also controlling said sprocket(s).

* * * * *